United States Patent [19]
Cooper

[11] Patent Number: 5,343,195
[45] Date of Patent: Aug. 30, 1994

[54] VARIABLE LENGTH CODEWORD DECODING APPARATUS

[75] Inventor: Jeffrey A. Cooper, Indianapolis, Ind.

[73] Assignee: Thomson Consumer Electronics, Inc., Indianapolis, Ind.

[21] Appl. No.: 995,404

[22] Filed: Dec. 18, 1992

[51] Int. Cl.⁵ ............................................. H03M 7/40
[52] U.S. Cl. ...................................... 341/67; 341/106
[58] Field of Search ........................... 341/67, 100, 106

[56] References Cited

U.S. PATENT DOCUMENTS

| | | | |
|---|---|---|---|
| 4,334,246 | 6/1982 | Saran | 358/261 |
| 4,396,906 | 8/1983 | Weaver | 341/65 |
| 4,568,916 | 2/1986 | Bahgat | 341/67 |
| 4,569,058 | 2/1986 | Grallert | 375/27 |
| 4,593,267 | 6/1986 | Kuroda et al. | 341/67 |
| 4,647,908 | 3/1987 | Ross et al. | 341/67 |
| 4,651,194 | 3/1987 | Grallert | 358/13 |
| 4,675,652 | 6/1987 | Machado | 341/67 |
| 4,899,149 | 2/1990 | Kahan | 341/67 |
| 4,922,510 | 5/1990 | Brusewitz | 375/122 |
| 4,937,573 | 6/1990 | Silvio et al. | 341/67 |
| 4,963,867 | 10/1990 | Bertrand | 341/60 |
| 4,967,196 | 10/1990 | Sprague et al. | 341/67 |
| 5,162,795 | 11/1992 | Shirota | 341/67 |
| 5,245,338 | 9/1993 | Sun | 341/67 |

OTHER PUBLICATIONS

An Entropy Coding System for Digital HDTV Applications by Shaw-Min Lei et al., IEEE Transactions on Circuits and Systems for Video Technology, vol. 1, No. 1, Mar. 1991.
A High-Performance Full-Motion Video Compression Chip Set, by Peter A. Ruetz et al., IEEE Transactions on Circuits and Systems for Video Technology, vol. 2, No. 2, Jun. 1992, pp. 111-121.
Designing a High-Throughput VLC Decoder Part II-Parallel Decoding Methods by Horing-Dar Lin, IEEE Transactions on Circuits and Systems for Video Technology, vol. 2, No. 2, Jun. 1992, pp. 197-206.

*Primary Examiner*—Marc S. Hoff
*Attorney, Agent, or Firm*—Joseph S. Tripoli; Eric P. Herrman; Ronald H. Kurdyla

[57] ABSTRACT

A variable length decoder including the cascade combination of a buffer memory for providing parallel-bit coded data in N-bit bytes, and a first barrel shifter having an R-bit input port and an R-bit output port (R>N). The R-bit output port of the first barrel shifter is coupled to respective first inputs of a bank of R two-input OR gates. The outputs of the OR gates are coupled to the parallel input of a register or latch, the output of which is coupled to the address input port of a lookup table for providing decoded versions of variable length codewords applied to its address port, and providing indicia which indicates the length of respective decoded variable length codewords. The output of the register is also coupled to the input of a second R-bit input R-bit output second barrel shifter. The output of the second barrel shifter is coupled to respective second input connections of said bank of OR gates. The indicia provided by the lookup table are applied to a Shift State Machine, which generates control signals to control the respective bit shift operations of the first and second barrel shifters. The combination of barrel shifters and the OR circuit provide for rapid application of successive variable length codewords to the lookup table.

4 Claims, 8 Drawing Sheets

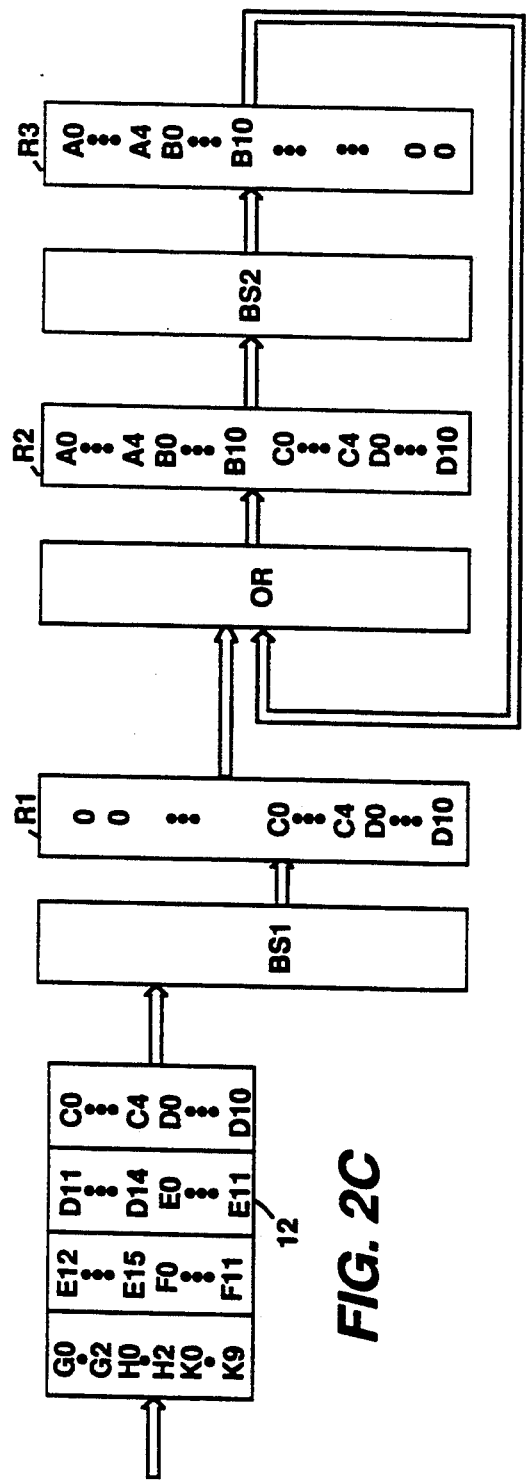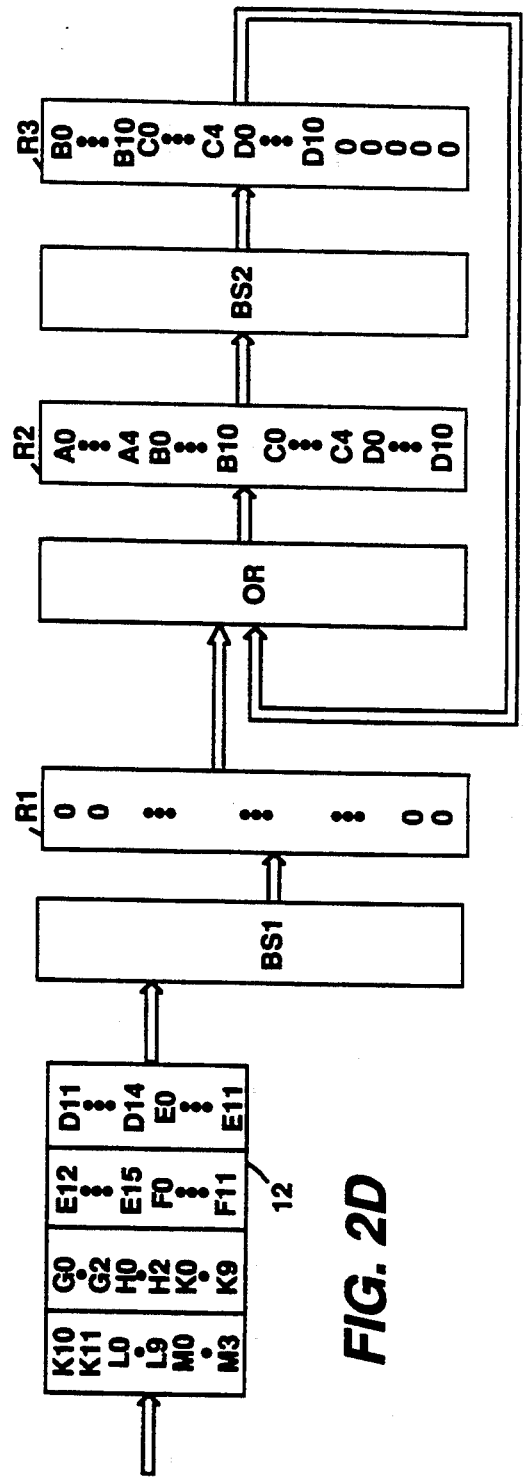

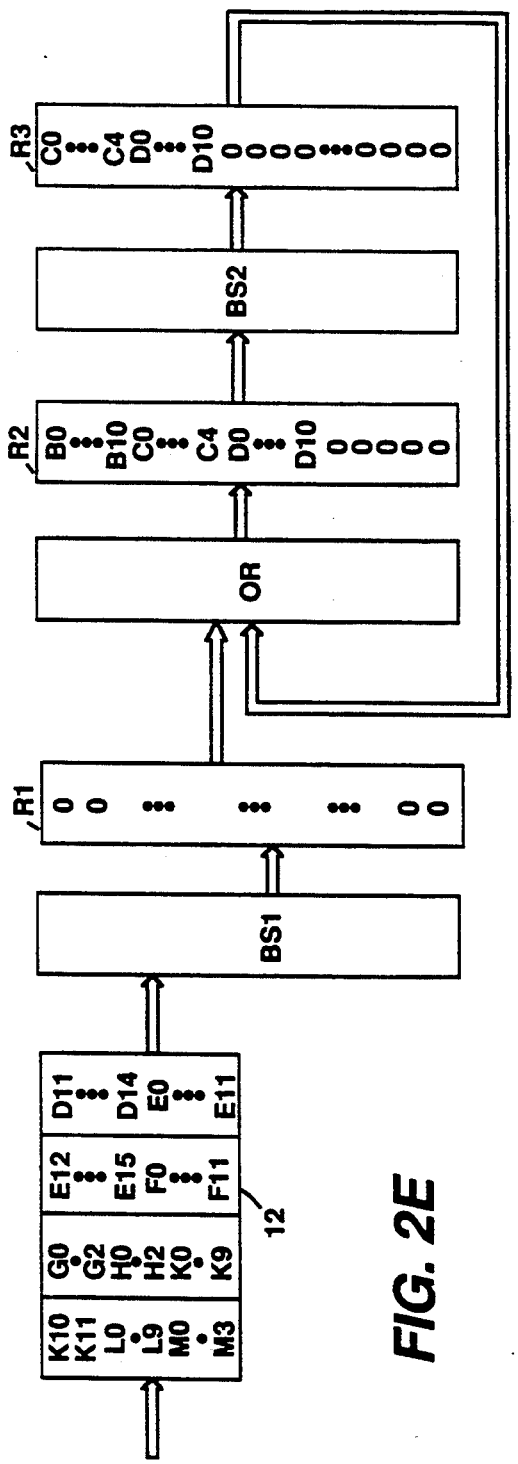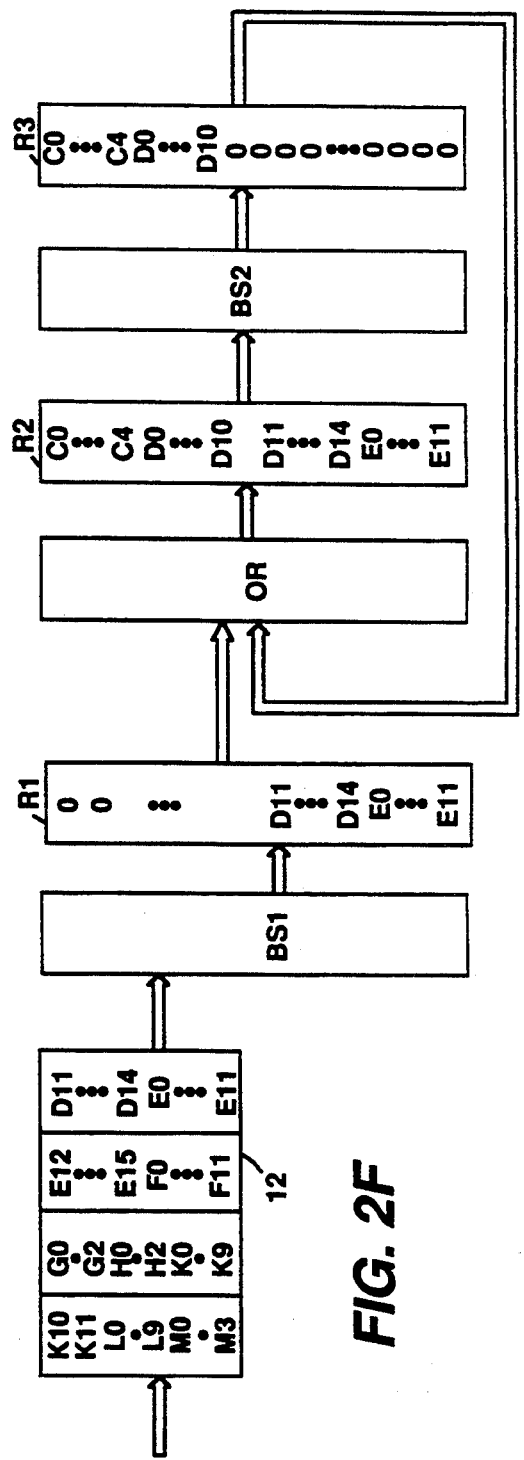

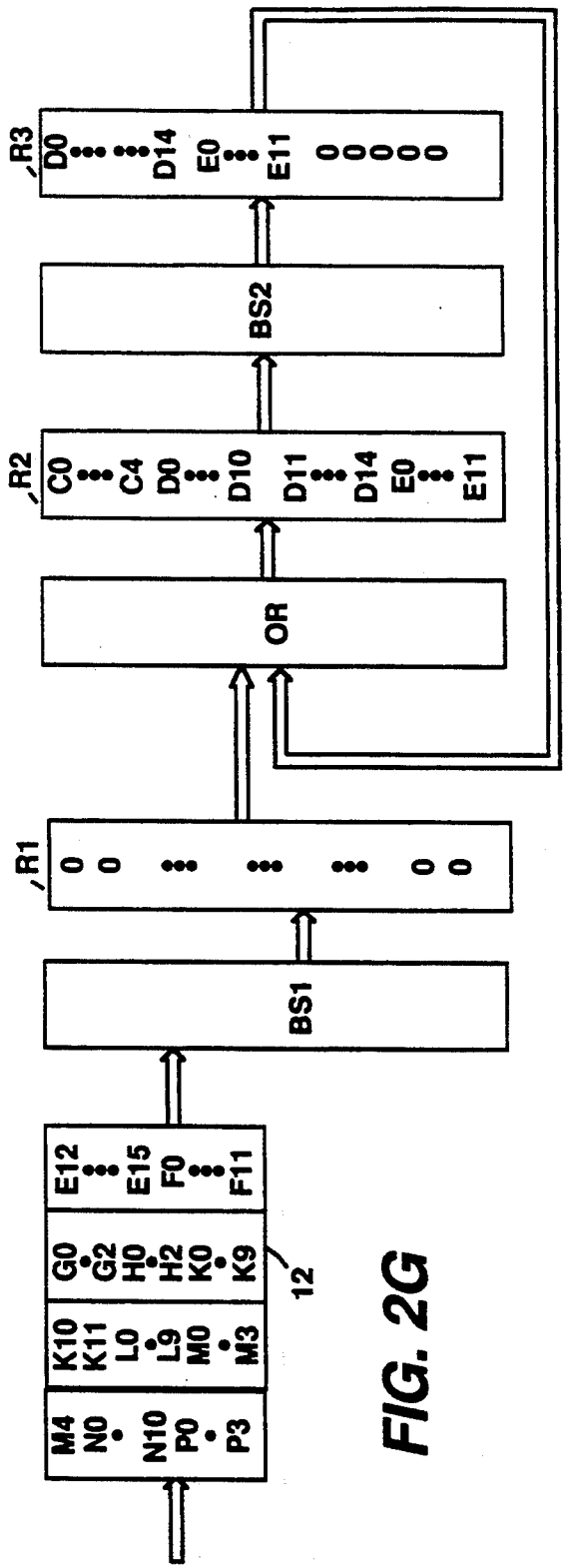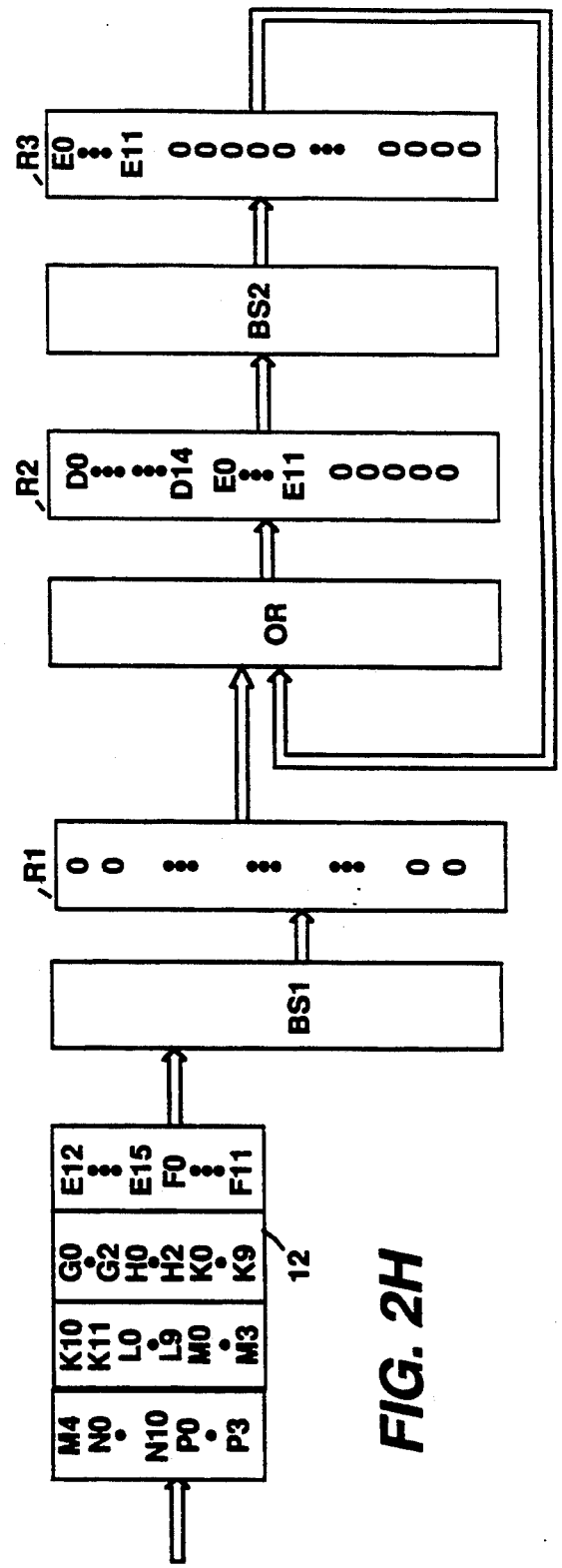

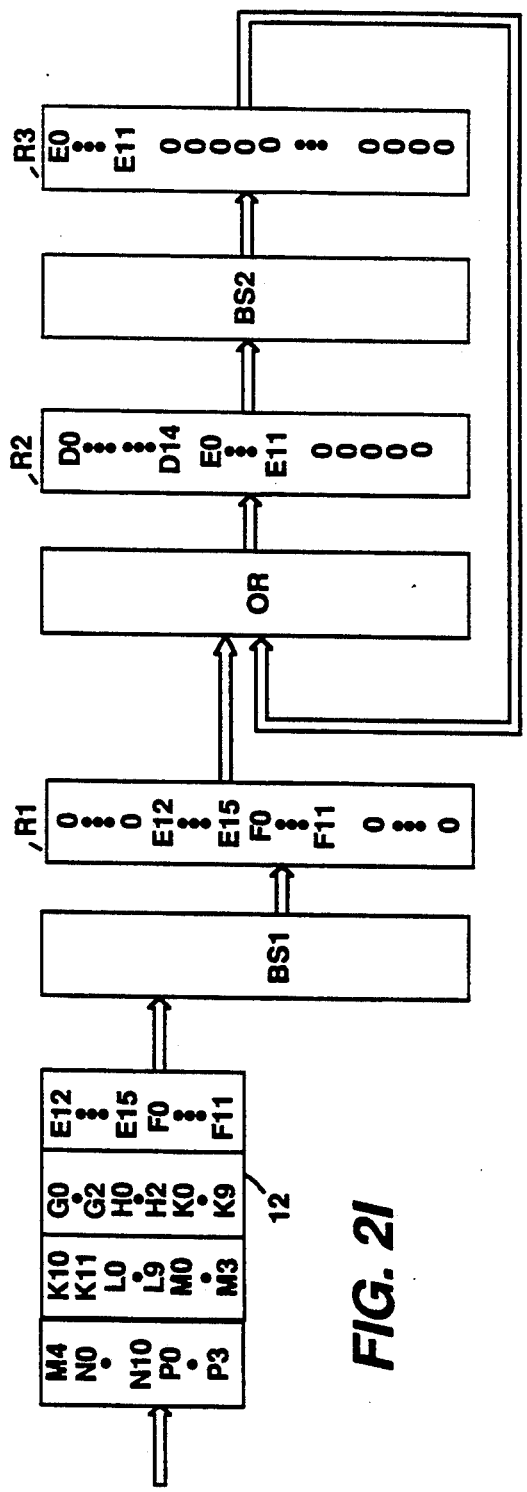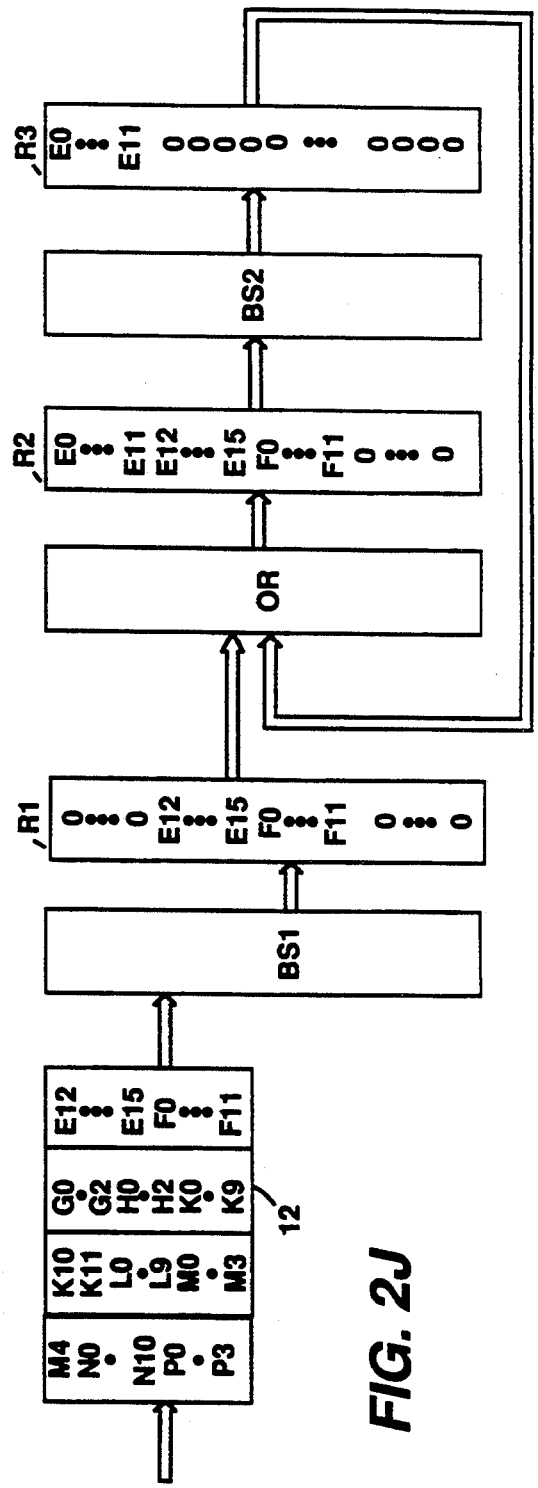

VARIABLE LENGTH CODEWORD DECODING APPARATUS

This invention is related to apparatus for decoding variable length codewords.

BACKGROUND OF THE INVENTION

Variable length codeword decoders (VLD's) are known in the art of signal transmission, and are implemented to decode variable length encoded signals. Variable length encoded signals are generated in pulse code modulated form, and respective codewords are concatenated without flags to distinguish successive codewords. Respective codewords may be formed with differing numbers of bits. Respective codewords include a prefix part and a data part. The prefix is utilized to facilitate separation of concatenated variable length codewords, and in general, is indicative of the number of bits comprising the particular codeword.

Typically, known VLD's include a lookup table to which successive bits of a variable length encoded signal are sequentially and cumutaively applied as address codes. When a sequence of bits applied to the address input port of the lookup table conforms to a valid variable length codeword, the lookup table provides a decoded representation of the variable length codeword, and a value representing the length of the variable length codeword. Responsive to the value representing the length of the variable length codeword, the decoded variable length codeword is stripped from the signal applied to the lookup table and the process is repeated.

One of the limiting factors in the operational speed of known VLD's is the rate of application of new codewords to the decoder lookup table. The present invention provides a novel circuit arrangement for arranging coded data for application to the address port of a VLD lookup table.

SUMMARY OF THE INVENTION

The present invention is a variable length decoder including the cascade combination of a buffer memory for providing parallel-bit coded data in N-bit bytes, (where N is for example 16), and a first barrel shifter having an N-bit input port and an R-bit output port (R an integer). The first barrel shifter is responsive to control signals for shifting the bit positions of said N-bit bytes applied to its input port, in parallel, to different bit positions of its R-bit output port. The R-bit output port of the first barrel shifter is coupled to respective first inputs of a bank of R two-input OR gates. The outputs of the OR gates are coupled to the parallel input of a register or latch, the output of which is coupled to the address input port of a lookup table for providing decoded versions of variable length codewords applied to its address port, and providing indicia which indicates the length of respective decoded variable length codewords. The output of the register is also coupled to the input of an R-bit input R-bit output second barrel shifter. The output of the second barrel shifter is coupled to respective second input connections of said bank of OR gates.

The indicia provided by the lookup table are applied to a Shift State Machine, which generates control signals to control the respective bit shift operations of the first and second barrel shifters. The combination of barrel shifters and the OR circuit provide for rapid application of successive variable length codewords to the decoder lookup table.

BRIEF DESCRIPTION OF THE DRAWINGS

FIGS. 2A–2J are abbreviated block diagrams of the FIG. 1, apparatus useful for showing the sequence of operation of the apparatus for a sequence of arbitrarily selected variable length codewords.

DETAILED DESCRIPTION

The input to a variable length decoder (VLD) is a bit stream without explicit word boundaries. The VLD successively performs decoding a codeword, determining its length and shifting the input bit stream by the number of bits corresponding to the length of the codeword decoded before decoding the next codeword. Typically decoding per se is performed using a codebook lookup table. Codebook lookup tables have parallel-bit input ports. Bits of the signal to be decoded, equal in number to at least the length of longest variable length codeword contained in the signal to be decoded, are applied to an input port of the codebook lookup table. The codebook lookup table is arranged to provide decoded codewords when a combination of bits applied to, for example, the more significant bit positions of the input port of the lookup table conform to a valid codeword. If the bits applied to the more significant bit positions of the input port are not recognized as valid codewords, the bits of the input signal are shifted in parallel in the direction of the more significant bit positions until a valid codeword match is found. The codebook lookup table outputs a decoded version of the codeword and a number which indicates the number of bits contained in the valid codeword. The bits of the input signal are then shifted in parallel, by this number, in the direction of the more significant bit positions of the codebook lookup table input port.

Consider that the input signal contains codewords varying in length from one to sixteen bits. It should be appreciated that performing the variable bit shifts over this range of codeword bit lengths will be time consuming. In systems arranged to process large amounts of coded data in limited time intervals, such as digital high definition television (HDTV) systems, the decode timing of variable length encoded signals is critical. Either extremely fast devices (and therefore expensive devices) are required, or the clever arrangement of less fast devices is required to accomplish the requisite decoding function in the available time. The present invention is directed to the latter approach, and representative apparatus is illustrated in FIG. 1.

Figure 1:
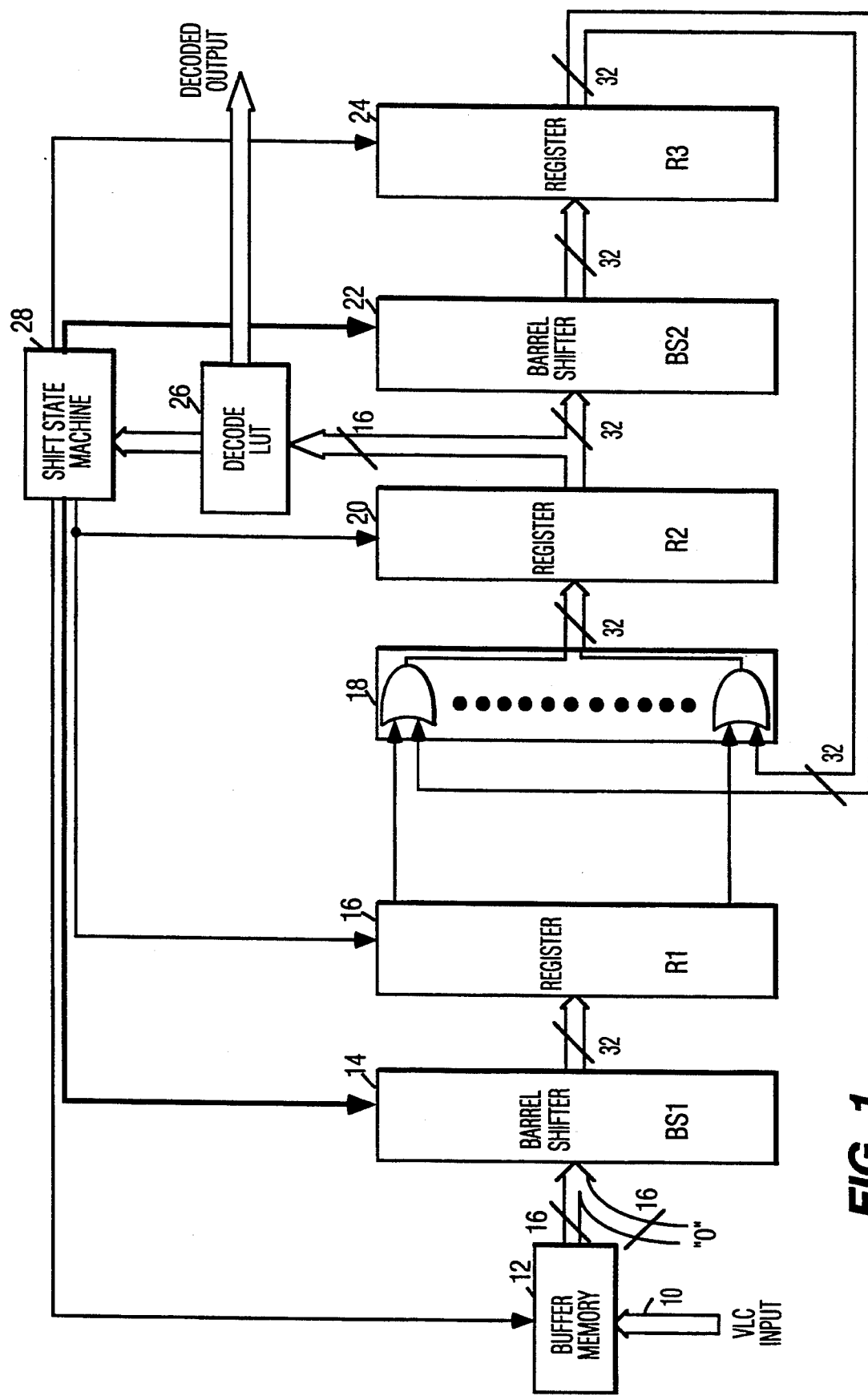
FIGS. 1 and 4 are block diagrams of alternative variable length decoders embodying the present invention.

Referring to FIG. 1, wide arrows cut by a diagonal line with a number adjacent thereto are busses having that number of parallel connections. In FIG. 1, the variable length codeword signal to be decoded is input to the system via the bus 10. The input signal is presumed to occur as parallel-bit samples of for example 16-bit bytes. These samples are applied to a buffer memory 12, which may be a first-in-first-out (FIFO) memory device. Data is supplied from the buffer 12, to a barrel shifter 14, under control of a Shift State Machine 28. In this example, the the barrel shifter has a 32-bit input port and a 32-bit output port. Sixteen contiguous input connections are coupled to the output port of the buffer memory and the remaining sixteen input connections are coupled to a logic zero value. The barrel shifter 14 can shift each 16-bit input byte, in parallel, to the 16 respective 16-contiguous-bit groupings of the shifter output connections. The output connections to which the 16-bit input byte is not directed, exhibit zero output values. Shifting of the input bytes is controlled by the Shift State Machine 28. For high speed video signal processing applications, the barrel shifter 14 may be type TI SN74AS8838 manufactured by Texas Instruments Corp., Dallas, Tex.

The barrel shifter output port is coupled to a register or latch 16, which stores and outputs the 32-bit output provided by the barrel shifter 14. The respective output connections of the register 16 are coupled to respective first input connections of a bank of 32 two-input OR gates 18. The imposition of the OR gates 18 facilitates the rapid rearrangement of data bits for application to the decoding table. The output connections of the OR gates 18 are coupled to a second register or parallel-bit latch 20, which stores and outputs the bit values provided at the output connections of the OR gates.

The register 20 has its output connections coupled to the address input port of codebook lookup table 26. Register 20 is included to maintain the signal bits coupled to the codebook lookup table stable during the time required to recognize valid codewords. Operation of the codeword lookup table is similar to the operational description presented above.

The output of the register 20 is also coupled to the input port of a second barrel shifter 22. Barrel shifter 22 has, in this example, a 32-bit parallel input port and a 32-bit parallel output port. Barrel shifter 22 is arranged to parallel shift the bit positions of the codewords applied to its input port, by a number of bit positions at least equal to the longest codeword that can occur in the input signal. The bit shifting provided by the barrel shifter 22 is controlled by the Shift State Machine 28. For each codeword decoded, the barrel shifter 22 is conditioned to shift the sample bits applied to its input port by a number of bit positions equal to the number of bits contained in the last codeword that was decoded.

Bit shifted codewords provided by the barrel shifter 22 are coupled to a further register or parallel-bit latch 24, which stores and outputs the data bits coupled thereto. The respective output connections of the register 24 are coupled to respective second input connections of the bank of two-input OR gates 18.

The codeword lookup table (DECODE LUT) 26 may be realized with a programmable logic array, or read only memory, or a content addressable memory etc. This device provides a decoded representation of variable length encoded codewords, when a combination of, for example more significant, bits of the coded signal applied to its input or address port conforms to a valid codeword. In addition it provides a value indicative of the bit-length of the valid codeword, which value is coupled to the Shift State Machine 28. The state Machine 28, responsive to these values, generates signals for controlling the bit shifting of both of the barrel shifters, and timing pulses for the registers and buffer memory.

Refer to FIGS. 2A–2J which illustrate in pictorial form the progression of input sample (codeword) bits through the decoder apparatus. In the FIGURES the buffer memory 12 is shown segmented into blocks, each of which contains one 16-bit input sample, that is the four samples nearest the output of the buffer memory are illustrated. Each 16-bit input sample may include one variable length codeword, a plurality of codewords, less than a codeword, or partial codewords. In the FIGURES the respective codewords are designated by capital letters followed by numbers representing the respective sample bits. The first sample is designated A, and comprises bits 0, 1, 2, 3, 4 which are identified by the notation A0 . . . A4. The second codeword is identified by the notation B0 . . . B10, and includes 11 bits (0, 1, 2, 3, 4, 5, 6, 7, 8, 9, 10). Note that the fourth codeword, D, is included in part, in both the second and third samples.

Figure 2A:
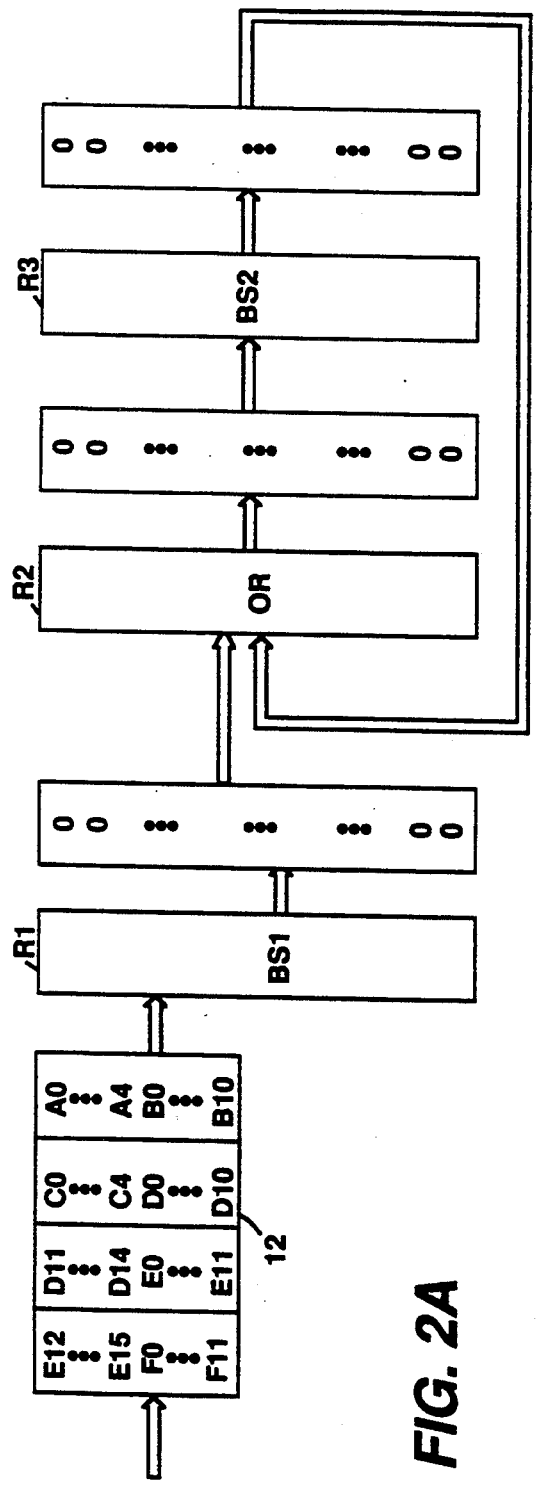
Figure 2B:
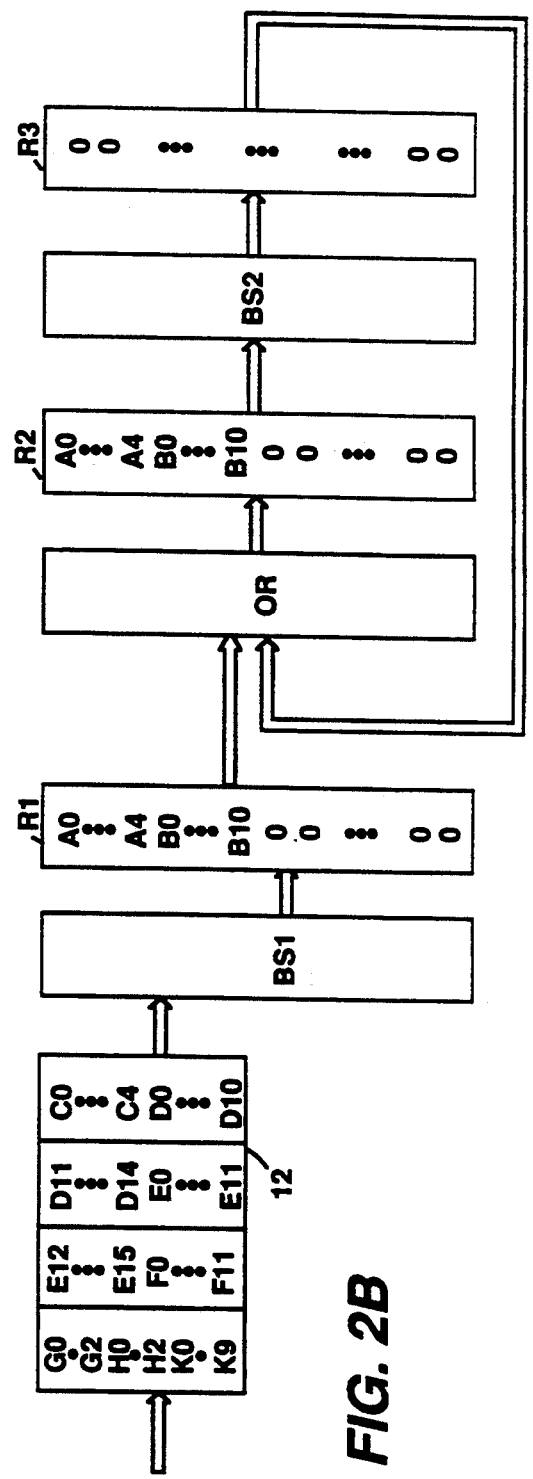

FIGS. 2A–2C illustrate a startup sequence. In FIG. 2A, the registers R1, R2 and R3 are all reset to zero and the first 16-bit sample is forwarded to the buffer output. At FIG. 2B the first sample (A0–A4, B0–B10) is conveyed without bit shifting by the shifter BS1 to the top 16 input connections of the register R1. This sample is coupled via the OR gates to the register R2. In FIG. 2C, the output of register R2 is coupled without bit shifting by the shifter BS2 to the register R3, and this sample is coupled back to the OR gates. Concurrently the second sample (C0–C4, Do–D10) in the buffer 12 is bit shifted by 16 bits and loaded in register R1. The samples in registers R1 and R3 are ORed in the OR gates and loaded into register R2. Register R1 is then reset to zero.

At this point, FIG. 2D, decoding begins. The bits A0–D10 are coupled in this order to, for example, the most significant to least significant bit positions of the input port of the codebook lookup table, The first most bits A0–A4 are recognized as a valid codeword. A decoded version of the codeword is output and a value indicative of the number of bits of codeword A is coupled to the Shift State Machine. In this instance the number of bits in codeword A is five, and the Shift State Machine, responsive thereto, generates a control signal to cause the shifter BS2 to bit shift the data applied to its input port upward by five bit positions. That is the input to the barrel shifter is shifted by an amount sufficient to exclude codeword A from being input to the register R3, and the remaining codewords to be coupled to the topmost bit positions in the register R3. The five lower most bit positions of register R3 will contain zero values, where the number five corresponds to the number of bit positions vacated by the sample A.

The Shift State Machine, responsive to the codeword length value makes a determination of the number of sample bits remaining in the register R3. If the number is equal to or less than the number of bits in the longest possible codeword used in the system, the next sample in the buffer 12 will be advanced to the register R1. If not, as in the present example, register R1 will be retained in a zero state, and the shifted sample bits in register R3 will be loaded into register R2 via the OR gates. The result of this transfer is illustrated in FIG. 2E. The data in register R2 is applied to the codebook lookup table and codeword B is recognized. A decoded version of codeword B is output and a length value of codeword B is applied to the Shift State Machine.

Responsive to the length value (in this instance 11), the Shift State Machine generates a control signal to condition the barrel shifter BS2 to bit shift the sample bits output by register R2 by eleven bit positions—to exclude sample B from being loaded into register R3 and to load the remaining bits contained in register R2 in the upper most bit positions of register R3. At this time register R3 holds 5 +11 or 16 zeroes in its lower bit positions. Responsive to the length value, the Shift State Machine determines the number of sample bits remaining in register R3, which in this instance is 16.

Since the number of bits in register R3 is equal to the longest codeword length for this example, the Shift State Machine advances the next sample in the buffer 12, and conditions the shifter BS1 to bit shift the sample to occupy the lowermost 16 bit positions of the register R1, as shown in FIG. 2F. The sample data in registers R3 and R1 are ORed and applied to register R2. Codeword C is now positioned in register R2 to be decoded.

Referring to FIG. 2G, register R1 is reset to zero values, codeword C is decoded and the sample bits in register R2 are bit shifted by the number of bits equal to the number of bits comprising codeword C, and loaded into register R3.

Referring to FIG. 2H the sample bits D0-E11 in register R3 are loaded into the register R2 via the OR gates, codeword D is decoded, and the sample bits in register R2 are bit shifted and loaded into register R3. At this time there are twelve sample bits and twenty zeroes in register R3. Hence a new sample must be loaded from the buffer memory 12 into register R1. The State Machine generates the control signals for conditioning the barrel shifter BS1 to apply the next sample byte to register R1, bit shifted thirteen bit positions from the topmost bit position (FIG. 2I). FIG. 2J shows this new sample ORed with the contents of register R3, and loaded into register R2, wherein codeword E is positioned for being decoded.

Note that when the contents of register R3 are ORed with the contents of register R2, the contents of the respective registered are positioned so that sample bits from registers R2 and R3 are applied to mutually exclusive OR gates.

Figure 3:
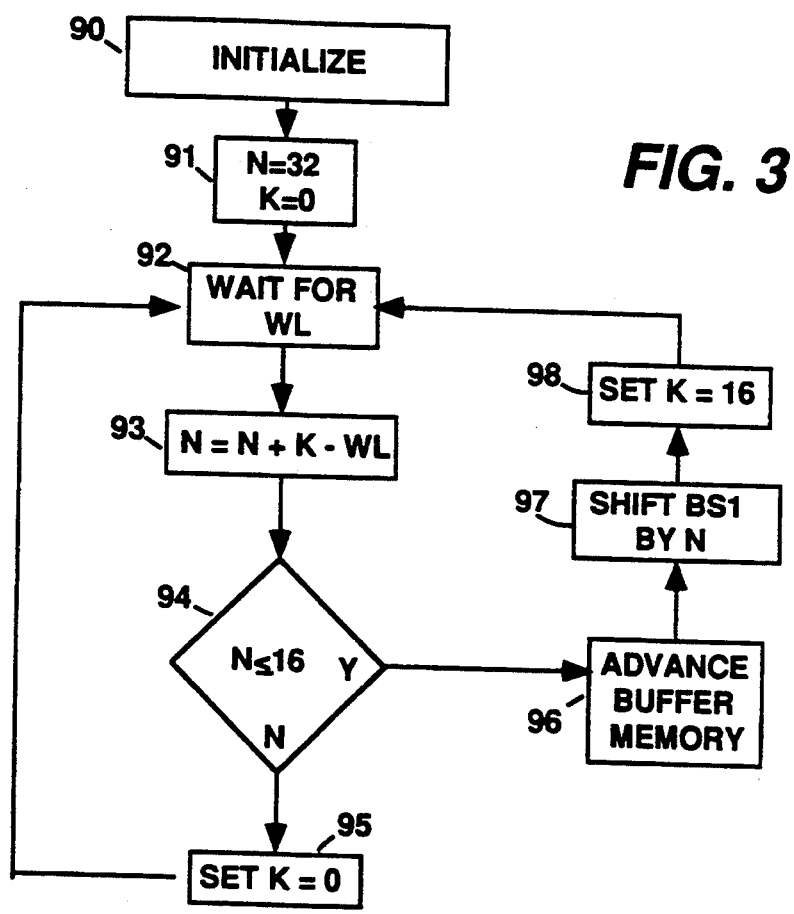
FIG. 3 is a flow chart depicting a portion of an exemplary algorithm performed by the Shift State Machine illustrated in FIGS. 1 and 4.

FIG. 3 illustrates an exemplary flow Chart describing an exemplary process utilized by the Shift State Machine for calculating the amount of bit shift to be applied by the barrel shifter BS1. In FIG. 3 the box 90 designated INITIALIZE includes the process of loading the initial two samples into the register R2. This creates a known starting point wherein the register R2 is completely filled with sample bits. At the step 91 two variables, N and K are initialized to 32 and zero respectively. The variable N corresponds to the number of bit positions in the register R2, and the upper value of the variable K is corresponds to the maximum number of bits comprising a variable length codeword.

After N and K are initialized the State Machine waits (92) for the codeword length, WL, of the next codeword decoded by the codebook lookup table. This value is subtracted from the value of N+K at step 93 to generate a new value N. The new value N represents the number of sample bits in register R3 after each successive codeword is decoded. If the remaining sample bits are greater than the maximum length codeword such that no new samples are added to the sample bits in register R2 and similarly R3 the value K is maintained at zero, and the remaining sample bits are equal to the starting value, i.e., N=32, minus the bits (WL) of the codewords that have been decoded. Each time a new sample is added to the register R2, K is set to 16 to accommodate for the addition of the new 16-bit sample to the cumulative difference value.

At the step 94 the value of N is checked to determine if the remaining sample bits in register R3 are less than K, in this example 16. If not a new sample is not transferred from the buffer memory to the register R2. Hence it is not necessary to generate a shift control signal for barrel shifter 14 (BS1). However a new sample may have been added to register R2 after the previous codeword was decoded, in which case K may have been set at 16. Thus at step 95 it is necessary to return the variable K to zero value.

Alternatively, if at step 94, N is less than or equal to K, the next sample in the buffer memory 12 is advanced to the barrel shifter 14, and a control signal is generated to condition the barrel shifter 14 to shift the bits applied to its input port by N bit positions. Register 16 is loaded and the variable K is set to 16. The State Machine then waits for the next WL.

Figure 4:
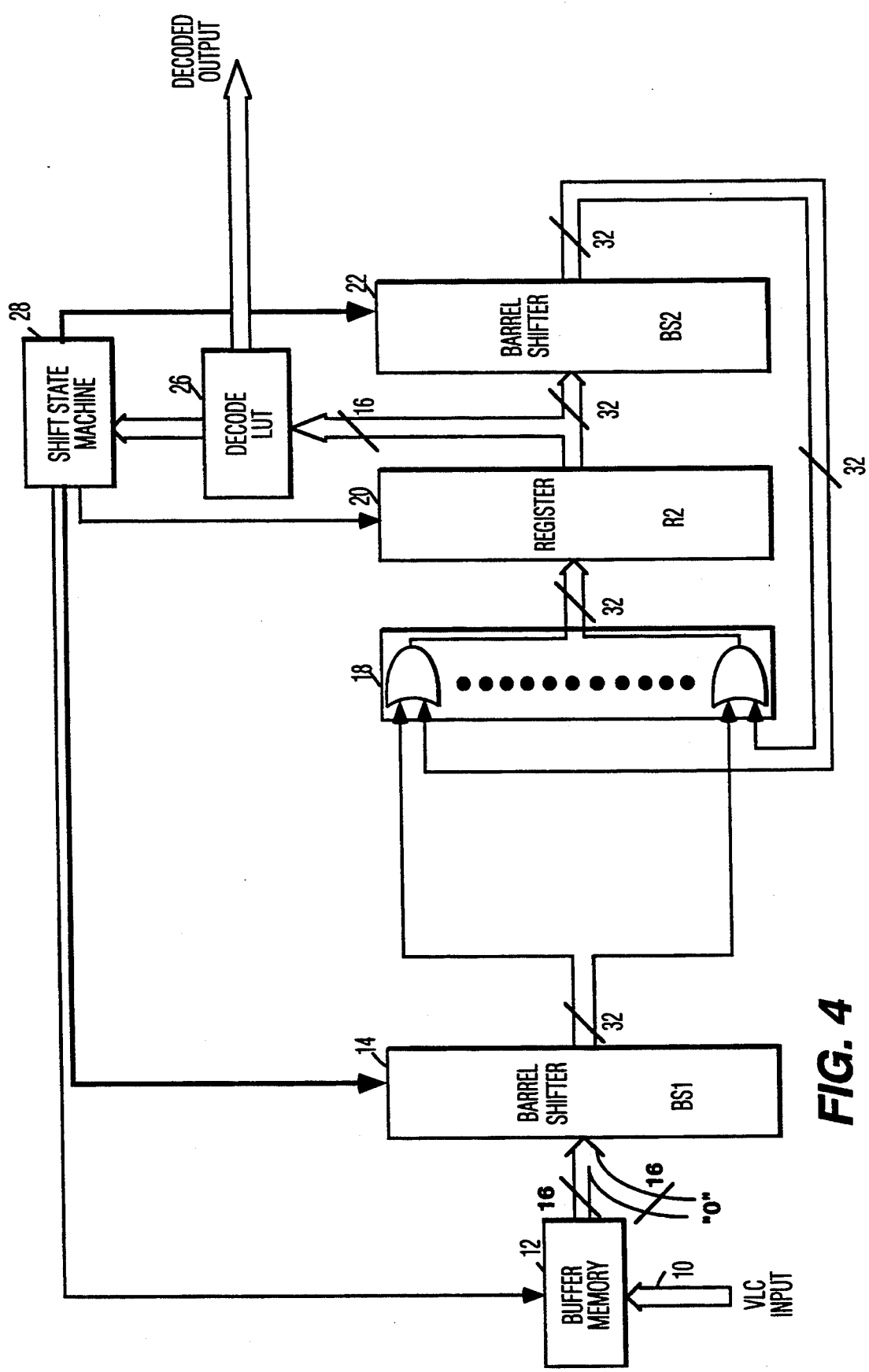

FIG. 4 illustrates an alternative arrangement of a VLD according to the invention. This arrangement is similar to the FIG. 1 arrangement with the exceptions that registers 16 and 24 are simply excised. Removing registers 16 and 24 tends to enhance the speed performance of the overall decoder, however this is at the expense of requiring slightly greater constraints in the timing of the control signals applied to the various devices. In addition it is necessary to condition the barrel shifter 14 to exhibit logic zeroes at all of its output connections when new sample values are not being added to register 20, but sample bits are being fed back from the barrel shifter 22. A further requirement is that register 20 (R2) be realized with a bank of latches similar to D-Type latches, that is latches or registers which capture the logic value present on its input immediately prior to applying a load command. In this manner the latch 20 can be arranged to feed back on itself without an intermediate storage element, and therefore the system throughput is increased.

Operation of the FIG. 4 apparatus is substantially similar to the operation of the FIG. 1 apparatus.

What is claimed is:

1. A variable length decoding apparatus comprising:
   a source of variable length encoded signal codewords configured in parallel-bit samples of constant sample bit-width X, said signal codewords having a maximum bit-width Z, X and Z being integers;
   a first bit shifter arranged to receive said parallel-bit samples, having a control input terminal and W parallel output terminals, where W is an integer greater than Z;
   a plurality of two-input ORing circuits having respective first input terminals coupled to respective ones of the output terminals of said first bit shifter, having respective second input terminals, and having respective output terminals;
   register means having parallel input terminals respectively coupled to the respective output terminals of said ORing circuits, and having parallel output terminals, said register means for temporarily storing sample bits provided by said ORing circuits;
   a second bit shifter having parallel input terminals respectively coupled to the respective output terminals of said register means, having a control input terminal, and having parallel output terminals respectively coupled to the respective second input terminals of said ORing circuits;
   variable length decoding means having at least Z parallel input terminals coupled to respective ones of the parallel output terminals of said register means for providing decoded values representing respective variable length codewords, and for providing values, WL, representing the number of bits included in respective variable length codewords;

a shift state machine, responsive to said values WL for generating and applying shift control signals to said first and second bit shifters.

2. The apparatus set forth in claim 1 wherein a further register having parallel input and output terminals is interposed between the output terminals of said second bit shifter and the second input terminals of said ORing circuits.

3. The apparatus set forth in claim 1 wherein a further register having parallel input and output terminals is interposed between the output terminals of said first bit shifter and the first input terminals of said ORing circuits.

4. The apparatus set forth in claim 1 wherein a further register having parallel input and output terminals is interposed between the output terminals of said second bit shifter and the second input terminals of said ORing circuits, and wherein a still further register having parallel input and output terminals is interposed between the output terminals of said first bit shifter and the first input terminals of said ORing circuits.

* * * * *